United States Patent [19]

Shariff et al.

[11] Patent Number: 4,528,614
[45] Date of Patent: Jul. 9, 1985

[54] ELECTRIC CONTROL CENTER HAVING INTEGRAL AIR-VENTILATION SYSTEM

[75] Inventors: Sadiq A. Shariff, Palos Park; Brij M. Bharteey, DuPage; Shahab A. Mehkri, Rich, all of Ill.

[73] Assignee: Westinghouse Electric Corp., Pittsburgh, Pa.

[21] Appl. No.: 540,068

[22] Filed: Oct. 7, 1983

[51] Int. Cl.$^3$ ............................................. H05K 7/20
[52] U.S. Cl. .................................. 361/379; 200/289; 361/383; 165/104.33
[58] Field of Search .......................... 174/15 R, 16 R; 361/356–358, 379, 381–384, 361; 165/104.33; 62/414, 418; 200/289

[56] References Cited

U.S. PATENT DOCUMENTS

| | | | |
|---|---|---|---|
| 3,626,251 | 12/1971 | Vigue | 361/384 |
| 4,025,747 | 5/1977 | Bharteey | 200/254 |
| 4,118,755 | 10/1978 | Davies | 361/379 |
| 4,386,651 | 6/1983 | Reinhard | 361/384 |

FOREIGN PATENT DOCUMENTS

| | | | |
|---|---|---|---|
| 2414823 | 10/1974 | Fed. Rep. of Germany | 361/379 |
| 109148 | 8/1979 | Japan | 361/379 |
| 136633 | 10/1979 | Japan | 361/379 |

Primary Examiner—G. P. Tolin

[57] ABSTRACT

An improved electric control center comprising a plurality of drawout type switchgear units housed in a cabinet having incorporated therein an integral air-ventilation duct system of modular snap-fitting construction having at least one air intake opening located at the bottom of the cabinet, one air exhaust opening at the top of the cabinet, and a plurality of branch ducts that communicate with a plurality of tandem compartments that are in stacked relationship and contain the respective switchgear units. The heat generated by the switchgear units and associated bus bars is thus removed from the cabinet by the air flow through the ventilator duct system.

3 Claims, 5 Drawing Figures

ELECTRIC CONTROL CENTER HAVING INTEGRAL AIR-VENTILATION SYSTEM

BACKGROUND OF THE INVENTION

This invention relates generally to switchgear apparatus and more particularly to an improved electric control center which houses draw-out type switchgear and has an integral ventilation means.

DESCRIPTION OF THE PRIOR ART

In draw-out type switchgear, bus bars distribute power to the individual switchgear circuit interrupter units that are arranged in a vertical stack, one on top of the other, and enclosed in a metal cabinet to form a compact electric control center. In these type designs the current-carrying capability of the bus bars and the control devices of the circuit interrupter units are is limited by poor heat dissipation within the control center. It would accordingly be desirable and advantageous if the ventilation of the control center could be improved since this would increase the overall efficiency of the interrupter units.

SUMMARY OF THE INVENTION

The present invention solves the foregoing problem by providing draw-out type switchgear which utilizes integral means for self-cooling the individual switchgear compartments of the cabinet which encloses the switchgear units. A main ventilating duct assembly within the switchgear housing has branches to each individual drawout compartment and provides an airflow path to vent openings at the top and bottom of the switchgear housing so that air may enter the enclosure through the bottom vent openings and cool the individual compartments as it blows upwardly through the switchgear housing and forces the entrapped heated air out of the housing through the top vent openings.

DESCRIPTION OF THE PREFERRED EMBODIMENT

This invention relates generally to an electric control center of the type disclosed in the application of Brij M. Bharteey, et al., Ser. No. 612,604 filed Sept. 11, 1975, now U.S. Pat. No. 4,025,747. Inasmuch as a detailed description of an electric control center is disclosed in the aforementioned patent, to which reference is made for complete description of structure and operation, the description of those portions is limited to the parts that are essential to the operation and understanding of the invention disclosed herein.

Figure 1:
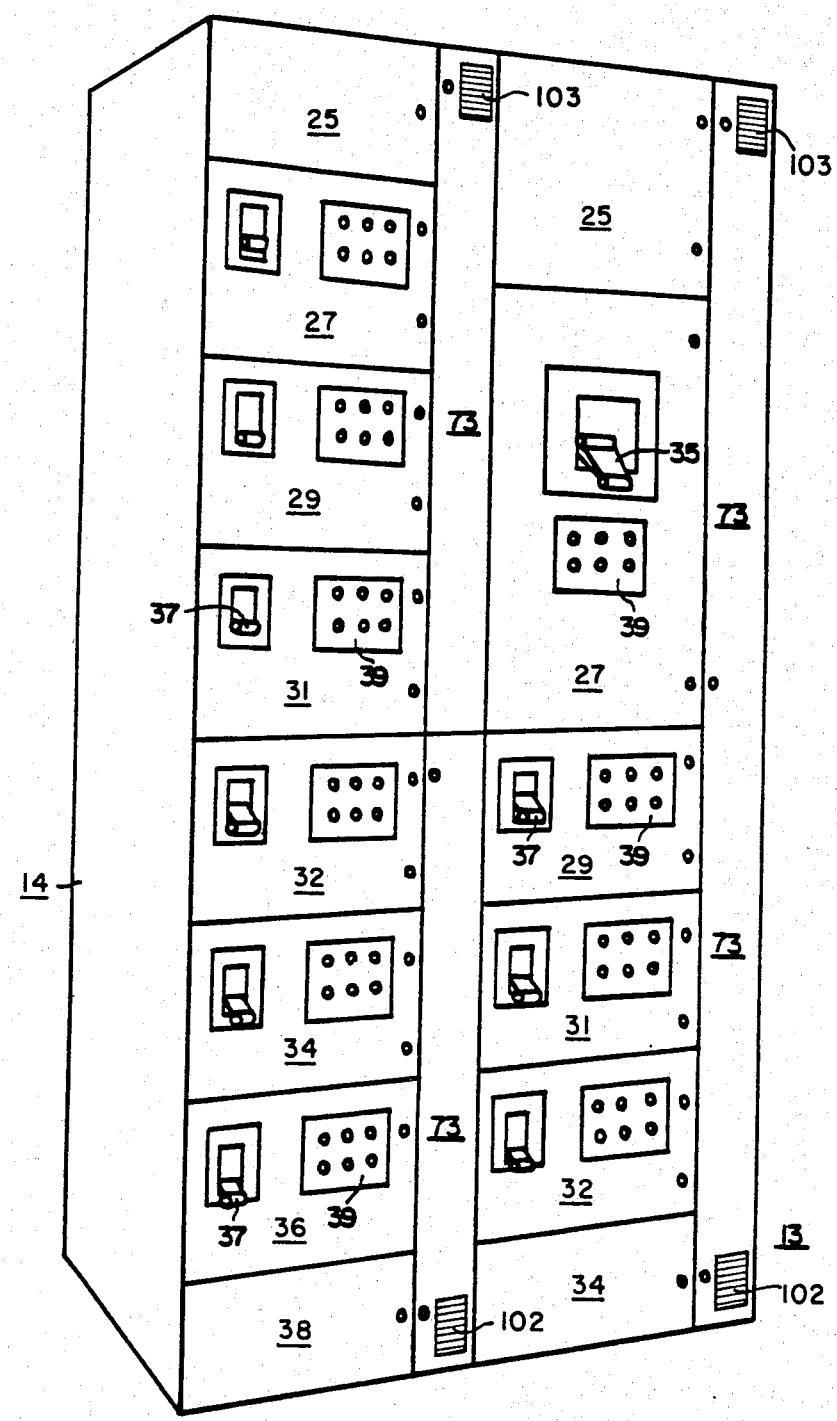
FIG. 1 is a perspective view of an electric control center which is air-cooled in accordance with the principles of this invention.
Figure 2A:
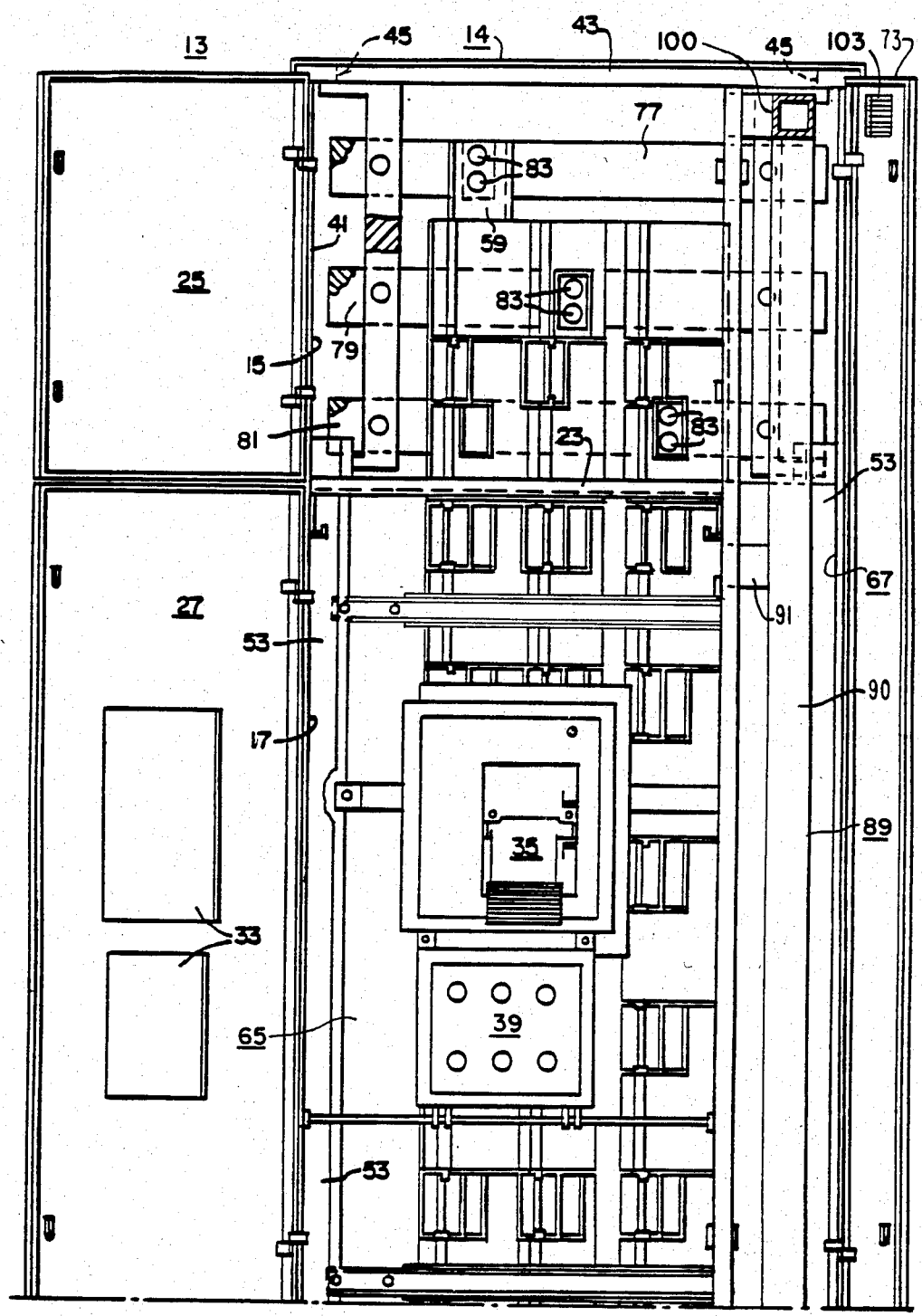
FIG. 2A is a front elevation view illustrating the upper half of the right module of the control center with the front doors open.
Figure 2B:
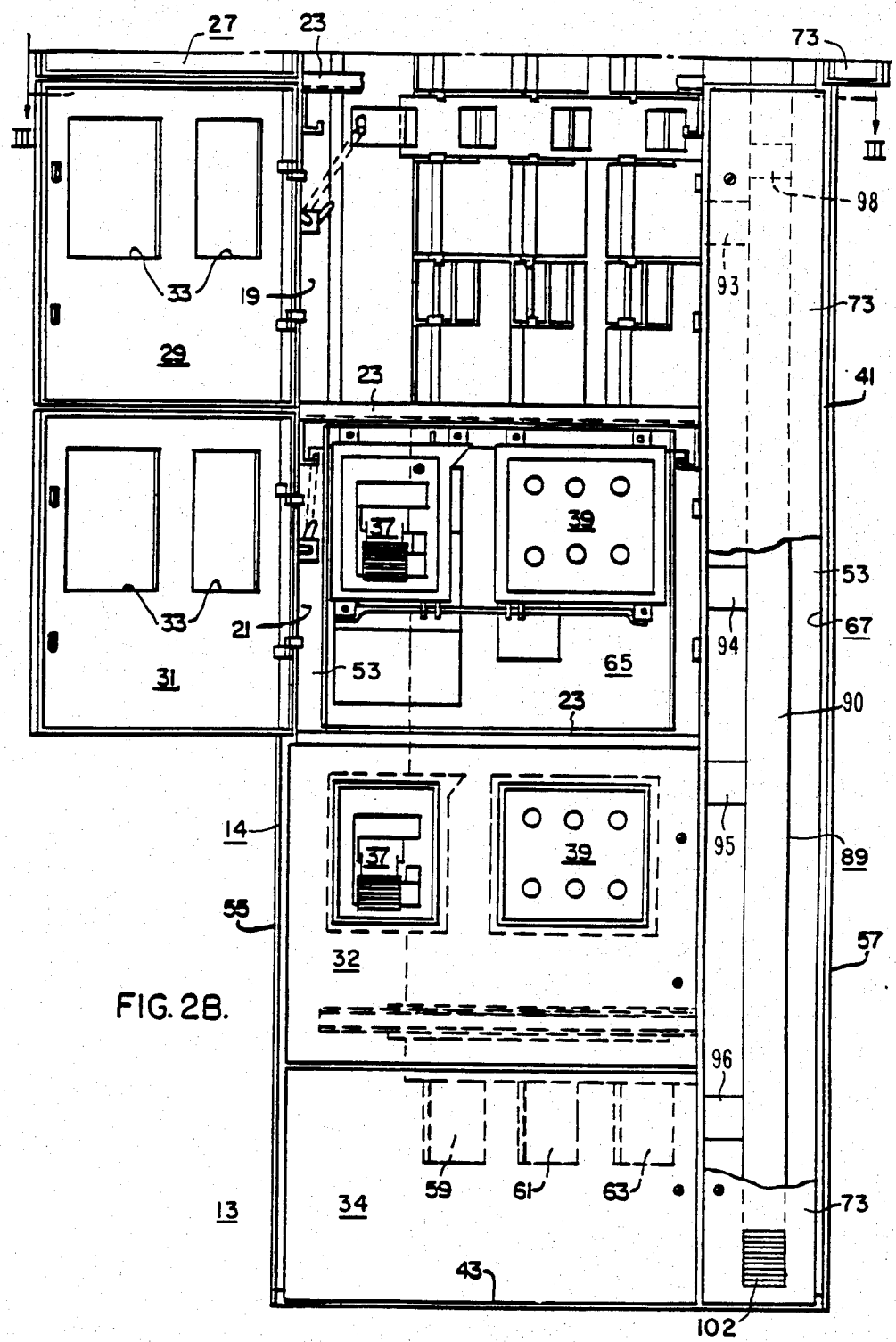
FIG. 2B is a front elevation view illustrating the lower half of the right module of the control center with two of the doors open.

The electric control center of this invention is generally indicated by reference numeral 13 in FIGS. 1, 2A, 2B and 3 and comprises a metal generally rectangular cabinet 14 having a pair of modules that are arranged in side-by-side relationship and contain a series of draw-out type circuit interrupter units that are vertically stacked one upon another. The left module has eight access doors 25, 27, 29, 31, 32, 34, 36 and 38. The right module has six access doors 25, 27, 29, 31, 32, 34 and since both modules have identical air-ventilating systems, only the right module will be described in detail. As shown in FIGS. 2A and 2B, the right module is divided into a plurality of vertically disposed compartments 15, 17, 19, and 21 by horizontal shelves 23. Each compartment 15, 17, 19, and 21 is accessible through doors 25, 27, 29, and 31, respectively, and the doors are provided with appropriate openings 33 to accommodate protruding portions of the enclosed circuit breakers such as handles 35, 37 and indicator light panels 39 as required.

Figure 3:
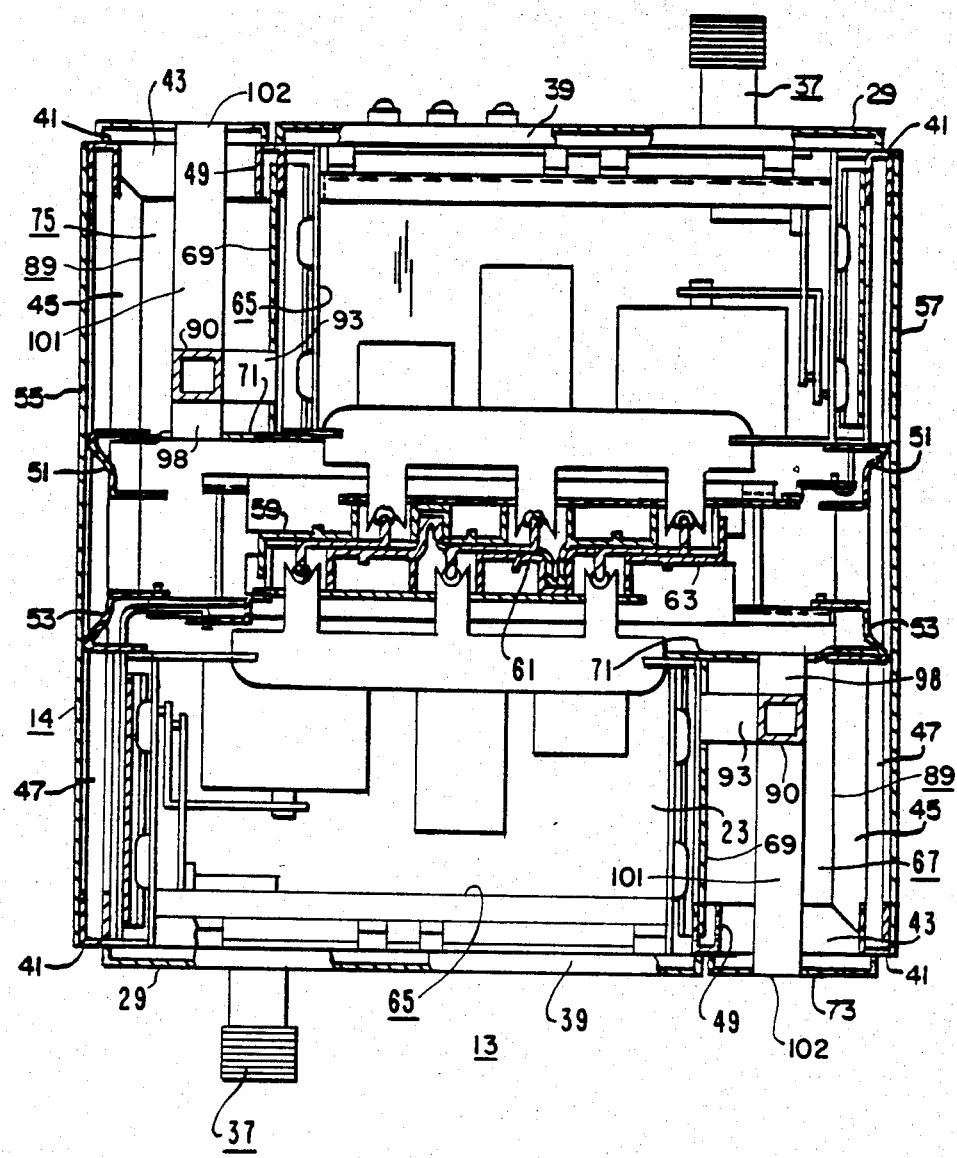
FIG. 3 is a horizontal sectional view of the control center, taken along the line III—III of FIG. 2B, illustrating the structural relationship of the air-duct system and enclosed interrupter units according to the invention.

The control center cabinet 14 includes a rectangular steel framework consisting of U-shaped corner posts 41 (shown in FIG. 3,) horizontal interconnectors 43, 45, at upper and lower ends and vertically spaced horizontal braces 47. In addition, the steel framework includes a pair of upright posts 49 located at the front and rear portions of the cabinet 14. Two pairs of support posts 51 and 53 are also disposed at opposite sides of the cabinet 14 adjacent to the opposite side wall panels 55 and 57, as shown in FIG. 3. The rear sides portion of the cabinet 14 is divided into compartments similar to compartment 15 through 21 at the front portion so that circuit interrupters 65 may be inserted into the cabinet 14 from opposite sides and engage (through suitable connectors) vertical bus bars 59, 61, and 63 (shown in FIG. 2B) which are centrally disposed between the front and rear portions of the cabinet 14. It will be understood, however, that the cabinet 14 will be of the same basic construction even though the rear portion of the cabinet may not be adapted for the mounting of another set of circuit interrupters 65. Suffice it to say, as shown in FIG. 3, the front portion of the cabinet 14 comprises stacked compartments 15, 17, 19, and 21 to the left of the upright post 49 and a vertically extending compartment 67 located between the upright post 49 and the adjacent corner 41. The compartment 67 is separated from the compartments 15 through 21 by a partition 69 and from the central area of the cabinet 14 (which houses the bus bars) by a partition 71. Access to the compartment 67 is provided by a vertical door 73. The compartment 67 extends vertically from the bottom to the lower top of the cabinet 14 and also serves as a passageway for electric wiring (not shown) leading from the circuit interrupters 65 disposed in the compartments 17, 19, and 21. An identical vertical compartment 75 located at the diagonally-opposite corner of the control center cabinet 14 is likewise utilized for the same purpose as the compartment 67 for those circuit interrupters 65 that are disposed at the rear portion of the cabinet 14.

Figure 4:
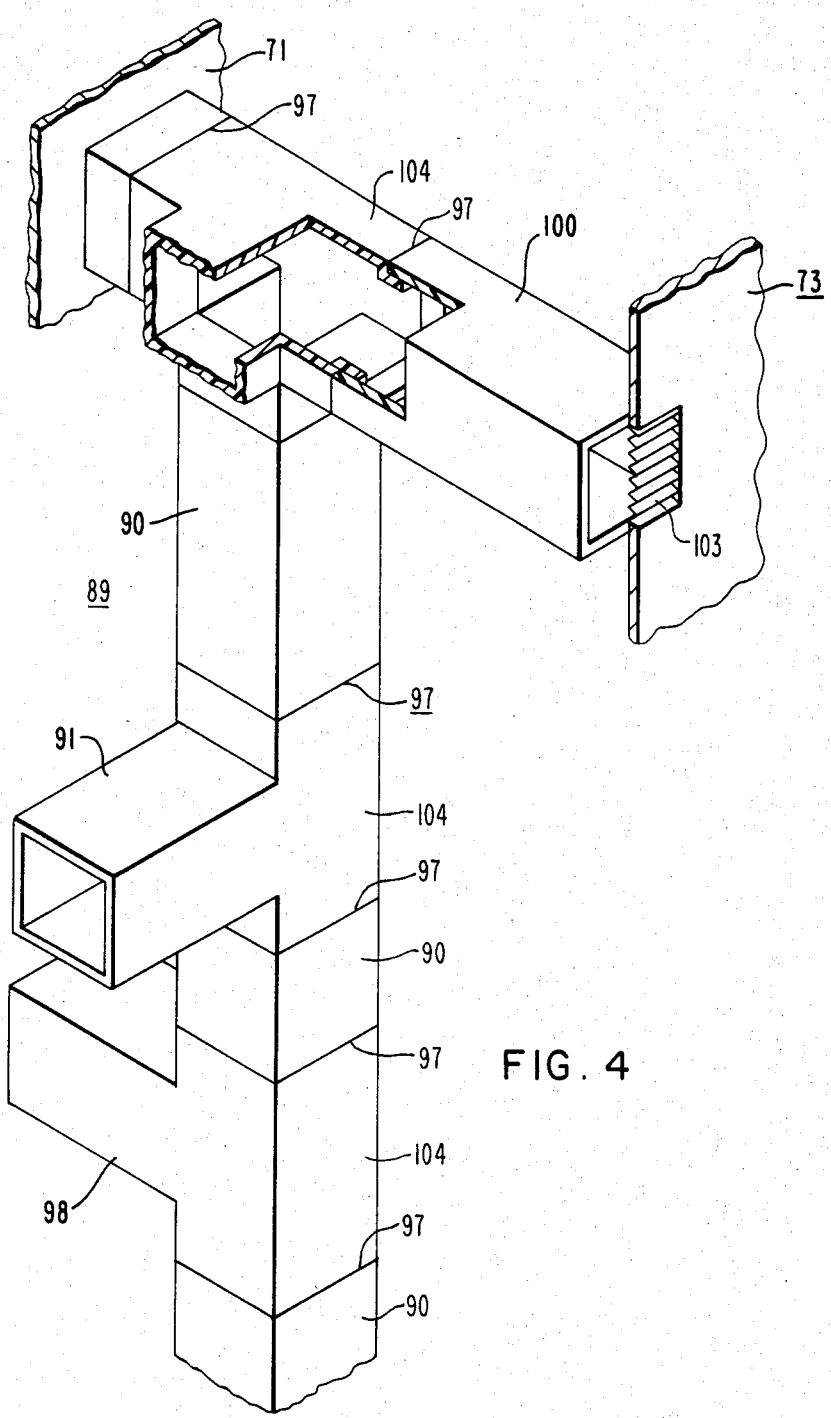
FIG. 4 is a partial perspective view of the modular ventilation assembly employed in the electric control center shown in the preceding Figures.

As shown in FIG. 2A, the upper ends of the vertical bus bars 59, 61, and 63 are attached to separate horizontal buses 77, 79 and 81, respectively, by suitable fastening means such as pairs of bolts 83. The bus bars 59, 61, and 63 extend vertically and substantially throughout the length of the cabinet 14, so that access to one or both sides of the bus bars may be had when the circuit interrupters 65 are inserted into the appropriate compartments. As illustrated in FIGS. 2A, 2B, and 4, a pair of ventilation duct assemblies 89 are provided in the vertically extending compartments 67 and 75 having a main vertically extending duct consisting of duct sections 90 that are joined to a plurality of T-shaped sections 104 that provide a series of transverse branch ducts 91, 93, 94, 95 and 96 which extend through the partitions 69 into the several compartments 15 through 21 and also transverse branch ducts 98, 99 that extend through the partitions 71 into the central area of the cabinet 14 which constitutes the bus bar compartment, thus providing an integral air-cooling system for the electric control center 13 according to the principles of this invention. The ventilation duct assemblies 89 are comprised of separate snaptogether component parts that interfit with one another (as shown in FIG. 4) and form a series of snap-lock joints 97 to facilitate easy construction and adapt to different control center designs. Another pair of branch ventilation ducts 100, 101 (FIGS. 3 and 4) extend from the ends of the ventilation duct assemblies 90 to louvered vent openings 102, 103 in the access doors 73 so that cool air may enter the bottom of the cabinet 14 through vent openings 102 and the entrapped heated air will exhaust from the top of the cabinet 14 through vent openings 103. Air is thus able to flow freely through the control center 13 and produce a "chimmey effect" that efficiently transfers generated heat out of the cabinet 14 and cools the interrupter units 65 and associated bus bar components. Although there has been illustrated and described a specific embodiment, it is to be clearly understood that such embodiment was chosen merely for purposes of illustration and that various changes and modifications may be readily made by those skilled in the art without departing from the spirit and the scope of this invention.

We claim:

1. Metal clad switchgear, comprising:
a generally elongated vertical housing;
horizontal barrier means dividing the generally vertical housing into a plurality of tandem compartments that are arranged in stacked relationship with one another;
upstanding partition means within said housing adjacent a wall thereof and defining a vertically-extending compartment that is separated from the tandem compartments by said partition means and traverses substantially the entire length of the housing;
stationary bus bars mounted in the housing and extending along substantially the full vertical length thereof;
an electrical circuit interrupter apparatus mounted in each of the respective tandem stacked compartments and individually electrically connected to the stationary bus bars; and
a generally vertically-extending ventilation duct assembly disposed in the vertically-extending compartment within said housing and having at least one air intake opening located at the bottom of the housing, one air exhaust opening located at the top of the housing, and a plurality of transverse branch ducts that communicate with the plurality of tandem compartments and is thereby adapted to effect heat transfer from the housing and air-cool the enclosed interrupter apparatus and bus bars.

2. Metal clad switchgear as recited in claim 1 wherein said housing comprises a generally rectangular cabinet and the generally vertically-extending compartment and said ventilation duct assembly are both located in a corner portion of the cabinet.

3. Metal clad switchgear as recited in claim 1 wherein the ventilation duct assembly comprises a plurality of separate duct components that are snap-locked with one another.

* * * * *